US012028025B2

(12) United States Patent
Francis

(10) Patent No.: US 12,028,025 B2
(45) Date of Patent: Jul. 2, 2024

(54) VARIABLE GAIN AMPLIFIER WITH TEMPERATURE COMPENSATED GAIN

(71) Applicant: MACOM Technology Solutions Holdings, Inc., Lowell, MA (US)

(72) Inventor: John R. Francis, Burlington (CA)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 275 days.

(21) Appl. No.: 17/397,833

(22) Filed: Aug. 9, 2021

(65) Prior Publication Data

US 2023/0040489 A1    Feb. 9, 2023

(51) Int. Cl.
*H03F 3/45*    (2006.01)
*H03F 1/30*    (2006.01)
*H03G 3/30*    (2006.01)

(52) U.S. Cl.
CPC ........... *H03F 1/30* (2013.01); *H03F 3/45475* (2013.01); *H03G 3/30* (2013.01); *H03F 3/45484* (2013.01); *H03F 2200/447* (2013.01); *H03G 2201/103* (2013.01)

(58) Field of Classification Search
CPC .. H03F 1/30; H03F 3/45475; H03F 2200/447; H03F 3/45484; H03F 2203/45492; H03F 2203/45508; H03F 3/45098; H03F 3/45; H03F 3/45183; H03F 3/45479; H03F 3/45071; H03F 3/45085; H03G 3/30; H03G 2201/103;

(Continued)

(56) References Cited

U.S. PATENT DOCUMENTS 6,016,051 A    1/2000 Can
7,034,606 B2 *   4/2006 Caresosa ................ H03G 1/007
                                                         327/563

(Continued)

OTHER PUBLICATIONS

Lukas, et al., "a Dimmable LED Driver with Resistive DAC Feedback Control for Adaptive Voltage Regularion", IEEE Transactions on Industry Applications, IEEE Service Center, vol. 51, No. 4, Jul. 1, 2015, pp. 3254-3262, XP011663155, ISSN: 0093-9994, doi: 10.1109/tia.2014.2387486.

*Primary Examiner* — Khanh V Nguyen
(74) *Attorney, Agent, or Firm* — Weide & Miller, Ltd.

(57) ABSTRACT

An amplifier with temperature compensation where the amplifier has transistors configured to amplify a received signal to create an amplified signal. The amplifier gain changes over temperature. A gain control circuit, connected to the amplifier, that adjusts the amplifier gain responsive to a gain control signal. A temperature compensation circuit includes numerous elements. A constant current source that generates a constant current which is used to create a constant voltage. A temperature dependent current source that generates a temperature dependent current which is used to create a temperature dependent voltage, such that the temperature dependent current source has an inverse temperature dependance as compared to the amplifier. An operational amplifier compares the constant voltage to the temperature dependent voltage and generates an offset signal which varies over temperature. A gated buffer is configured to receive the offset signal and responsive thereto, selectively modify the gain control signal.

15 Claims, 3 Drawing Sheets

(58) Field of Classification Search
CPC .............. H03G 1/0023; H03G 1/0088; H03G 3/45098; H03G 3/3042
USPC ................ 330/254, 256, 266, 272, 278, 289
See application file for complete search history.

(56) References Cited

U.S. PATENT DOCUMENTS

| | | | |
|---|---|---|---|
| 7,701,288 B2* | 4/2010 | Hou .................... | H03F 3/45197 330/254 |
| 7,778,294 B2 | 8/2010 | Nishimura et al. | |
| 7,889,006 B1* | 2/2011 | Jones .................. | H03F 3/45098 330/254 |
| 10,128,804 B2* | 11/2018 | Rane ..................... | H03F 1/3211 |
| 10,396,811 B1 | 8/2019 | Rankin et al. | |
| 2003/0098744 A1* | 5/2003 | Banba ................. | H03G 1/0023 330/252 |
| 2009/0238226 A1 | 9/2009 | Moto et al. | |
| 2013/0070796 A1 | 3/2013 | Belloni et al. | |
| 2014/0266453 A1* | 9/2014 | Robinson ............ | H03G 3/3084 330/278 |
| 2015/0326197 A1* | 11/2015 | Jayaraman ........... | H03G 1/0029 330/254 |
| 2018/0191321 A1 | 7/2018 | Rane et al. | |

\* cited by examiner

VARIABLE GAIN AMPLIFIER WITH TEMPERATURE COMPENSATED GAIN

1. FIELD OF THE INVENTION

The invention relates to variable gain amplifiers and in particular, a method and apparatus for temperature compensation.

2. RELATED ART

Variable gain amplifiers (VGA) are a common element in numerous electronic devices, allowing a circuit design to adjust the gain of an amplifier in response to changes in input signal power or desired output power. One challenge with amplifier design and implementation is temperature drift. Temperature drift occurs because the behavior, such as the resistance of amplifier devices, changes with temperature, thus negatively impacting linearity over temperature.

One proposed solution to overcome this drawback associated with amplifier design is to define gain levels based on one or more resistor values. In addition, temperature compensation over temperature of the gain is achieved by directly biasing the NPN amplifier devices with a positive temperature coefficient current. The drawback to directly biasing NPN amplifier devices with positive temperature coefficient current is that this proposed solution results in a change to the common mode voltage for the signal and therefore undesirably affects the linearity and maximum allowable amplifier swing.

Another proposed solution to the drawbacks of the prior art is to define or control the amplifier gain level with an NMOS (n-channel metal-oxide semiconductor) device and use a continuous feedback loop to monitor output swing and then adjust the gain setting to maintain desired output swing. However, this proposed solution requires a feedback loop with very long time constant and gain control with very fine step size. This results in circuitry requiring a large area for digital control logic and DACs, which consumes space and power.

SUMMARY

To overcome the drawbacks in the prior art and provide additional benefits, an amplifier with temperature compensation is disclosed. In one embodiment, the amplifier has one or more transistors configured to amplify a received signal to create an amplified signal. As discussed herein, the one or more transistors have a gain that changes over temperature. Also part of this embodiment is a gain control circuit and a temperature compensation circuit. The gain control circuit is connected to the amplifier and configured to adjust the gain of the amplifier responsive to a gain control signal. The temperature compensation circuit comprises a constant current source configured to generate a constant current which is used to create a constant voltage. Also part of the temperature compensation circuit is a temperature dependent current source configured to generate a temperature dependent current which is used to create a temperature dependent voltage. The temperature dependent current source has an inverse temperature dependance as compared to the amplifier. An operational amplifier is configured to compare the constant voltage to the temperature dependent voltage and generate an offset signal which varies over temperature. A gated buffer is configured to receive the offset signal and responsive thereto, selectively modify the gain control signal.

In one embodiment, the temperature dependent current source generates a current which varies over temperature inversely to the gain of the amplifier. In one configuration, the two or more transistors have a negative temperature coefficient that changes the gain over changes in temperature. It is contemplated that the gain control circuit may include one or more FETs and the gain control signal adjusts the resistance of the FETs in the gain control circuit to adjust the gain of the amplifier. In one embodiment the offset signal adjusts a FET resistance that generates the temperature dependent voltage. The gated buffer may receive a control signal to control gain and the control signal is modified by the offset signal.

Also disclosed herein is an amplifier with a temperature compensated gain control comprising an amplifier configured to amplify a received signal to create an amplified signal. The amplifier has a temperature coefficient that causes the gain to vary with changes in temperature and the gain is determined based on a gain control signal. A gain control circuit is configured to generate the gain control signal based on a control signal. Also part of this embodiment is a temperature compensation circuit configured to generate a gain offset signal which selectively modifies the gain control signal such that the temperature compensation circuit has a temperature coefficient that is inverse to that of the amplifier.

In one embodiment, the amplifier has a negative temperature coefficient, and the temperature compensation circuit has a positive temperature coefficient. Conversely, it is contemplated that the amplifier has a positive temperature coefficient, and the temperature compensation circuit has a negative temperature coefficient. In one configuration, the gain control circuit comprises one or more transistors which act as open circuits or variable resistors, and the amount of resistance is determined by the gain control signal. It is also contemplated that the temperature compensation circuit may include a feedback loop which is configured to generate the gain offset signal which varies with changes in temperature. As such, the feedback loop may further comprise an operational amplifier which generates the gain offset signal, and the gain control circuit further comprises a buffer which receives both the control signal and the gain offset signal and modifies the control signal based on the gain offset signal. In one embodiment, the temperature compensation circuit includes a current source which generates a temperature dependent output.

Also disclosed is a method for temperature compensating amplifier gain comprising providing an amplifier having a temperature coefficient that causes the gain of the amplifier to vary with changes in temperature. Also provided is a temperature compensation circuit that generates a gain offset signal, such that the temperature compensation circuit has a temperature coefficient which is the inverse of the amplifier's temperature compensation circuit. This method then receives an input signal for amplification and amplifies the signal with an amplifier to create an amplified signal. The level of amplification is determined by a gain control signal. This method also generates a gain offset signal with the temperature compensation circuit such that the gain offset signal counteracts the effects of temperature change induced gain variation in the amplifier to thereby maintain linearity in the amplified signal over temperature.

In one embodiment, the amplifier includes one or more transistors which have a negative temperature coefficient, and the temperature compensation circuit includes one or more current sources which have a positive temperature coefficient. It is contemplated that the gain control signal comprises two or more signals which are provided to two or more FETs to selectively adjust the resistance across the two or more FETS, which in turn controls the gain of the amplifier. This method of operation may further comprise generating the gain offset signal with a feedback loop within the temperature compensation circuit such that the feedback loop includes a feedback signal that varies with changes in temperature. In addition, the method may also include receiving a control signal and the gain offset signal at a buffer and modifying the control signal with the gain offset signal to generate the gain control signal.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
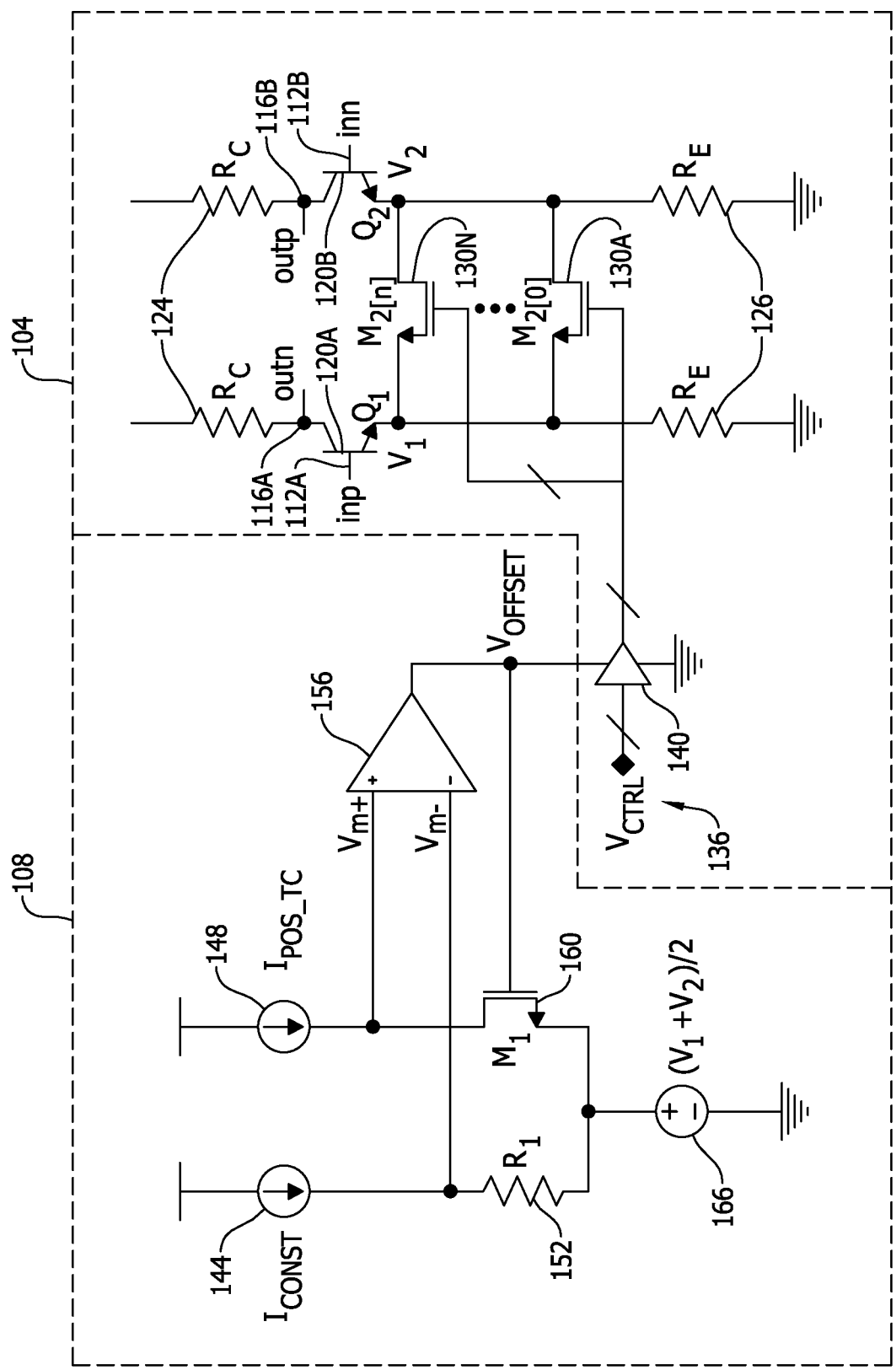
FIG. 1 is a circuit diagram illustrating an example embodiment of a variable gain amplifier stage with temperature compensated gain.

To overcome the drawbacks of the prior art and provide additional benefits, a method and apparatus for temperature compensation of an amplifier, such as a variable gain amplifier. FIG. 1 is a circuit diagram illustrating an example embodiment of a variable gain amplifier stage with temperature compensated gain. This is but one possible embodiment, and those of ordinary skill in the art may arrive at different implementations without departing from the scope of the invention.

Variable Gain Amplifier

As shown in FIG. 1, a variable gain amplifier 104 is connected to a temperature compensation module 108. The variable gain amplifier is configured as a differential signal device and includes amplifying transistors Q1, Q2 120A, 120B, which have signal inputs 112A, 112B that which receive differential input signals. Output paths 116A, 116B provide amplified differential signals from the transistors Q1, Q2 120A, 120B as shown. The transistors Q1, Q2 120A, 120B are arranged as shown to amplify the input signals provided to the base of each transistor. In this embodiment the transistors Q1, Q2 120A, 120B are NPN devices. Collector resistors 124 connect to the collector of the transistors 120A, 120B, while emitter resistors 126 connect to the emitters of the transistors 120A, 120B. In other embodiments, the transistors 120A, 120B may be replaced with CMOS or NMOS devices, or FETs. In addition, it is contemplated that the resistors 126 may be replaced with devices for implementing current sources.

As is understood in the art, transistors Q1, Q2 120A, 120B have performance which varies over temperature, and this variance introduces non-linearity into the amplified signal. This is a drawback to prior art systems.

Controlling the gain of the amplifying transistors 120A, 120B are two or more NMOS FETS M2 130A, 130N where N is any whole number. The gain control FETs M2 130A, 130N are connected between the emitter terminals of the amplifying transistors 120A, 120B as shown by nodes identified by voltage V1 and voltage V2. The gate of each gain control FETs M2 130A, 130N receives a gain control value, which in turn selectively establishes an open circuit or resistive path between nodes V1 and V2. The magnitude of the voltage presented at the gate of each FET M2 130 controls the resistance between the source and the drain of each FET. By selectively enabling and adjusting the resistance of the two or more gain control FETs M2 130A, 130N, the gain of the amplifier is adjusted. Changes in the voltage value provided to the gate terminal of each gain control FETs M2 130A, 130N change the resistance across the source and the drain of each FET, which in turn adjusts the gain of the amplifying transistors 120A, 120B. The greater the voltage presented to the gate terminal of a FET M2 130, the lower the resistance across the FET, and reducing the resistance across the FET M2 130 increases the gain of the amplifier.

A gain control voltage 136 is provided to a gated buffer 140, the output of which is distributed to the gate terminal of gain control FETs M2 130A, 130N as shown. The gain control voltage 136 may be multiple parallel conductive paths and the gated buffer 140 may be one or more buffers, which are distributed to the gate of the gain control FETs M2 130A, 130N. In one configuration, the gated buffer 140 comprises numerous gated buffers [0] through [n] and each gated buffer output is provided to a gate terminal of a FET M2 130 which also number [0] through [n]. The value of each gated buffer may be the same, different, or any combination of the same and different. Hence, some gate terminals of the FETs may receive a zero value voltage while other gate terminals may receive a non-zero voltage value. Also provided as an input to the gated buffer 140 is an offset signal Voffset which adjusts the non-zero output of the gated buffer 140 as described below. The Voffset is the temperature compensation input to the gated buffer 140.

Temperature Compensation

Included in the temperature compensation aspects of the circuit of FIG. 1 is a Iconst current source 144 which generates a current that is constant over temperature. In one embodiment, the current Iconst is generated by blending two currents, one from a current source having a positive temperature coefficient, and one from a current source having a negative temperature coefficient. The current Iconst is provided to a resistor R1 152 and to a negative input terminal of an operational amplifier (op amp) 156. Because Iconst is constant over temperature, the voltage across resistor R1 152 is also constant over temperature, which results in the input Vm− to the op amp 156 being constant over temperature.

A current source 148 generates a current Ipos_tc which is a current that has a positive temperature coefficient, meaning that as temperature varies over temperature, the current Ipos_tc also changes. In particular, the current Ipos_tc increases as temperature increases and the current Ipos_tc decreases in response to decreasing temperature. The current Ipos_tc is provided to a FET M1 160 which creates a voltage Vm+, which is provided to the positive input terminal of the op amp 156. The op amp 156 compares each input to generate an output signal which is defined herein as voltage Voffset. The op amp 156 is configured to, using the feedback signal Voffset discussed below, minimize the difference between its two inputs.

The voltage Voffset is provide to the gate terminal of the FET M1 160 to control the resistance from the drain to source terminals of the FET M1 160. For a particular temperature, changing the resistance of the FET M1 160 also changes the input voltage provided to the positive input to the op amp 156. The voltage Voffset from the op amp 156 is also provided to as an offset voltage to the gated buffer 140 to adjust, based on temperature, the gain control signal provided from the gated buffer to the gain control FETs M2 130.

A voltage source 166 connects to the opposing terminal of resistor R1 162 and to the source terminal of the FET M1 160. The voltage source 166 functions to bias the FET M1 160 at the same value as the FETS M2 130. Thus, the source terminal of M1 and M2 are maintained at approximately the same voltage to have the devices M2 operating in the triode region. When balanced, voltages V1, V2 will be equal, and the voltages V1 and V2 in the voltage source 166 are the same value as the voltages V1, V2 in the amplifier 104. In this embodiment, the voltage (V1+V2)/2 is the common mode voltage. The voltage source 166 may comprise a transistor or a resistor that creates the defined voltage.

System Operation

Figure 2:
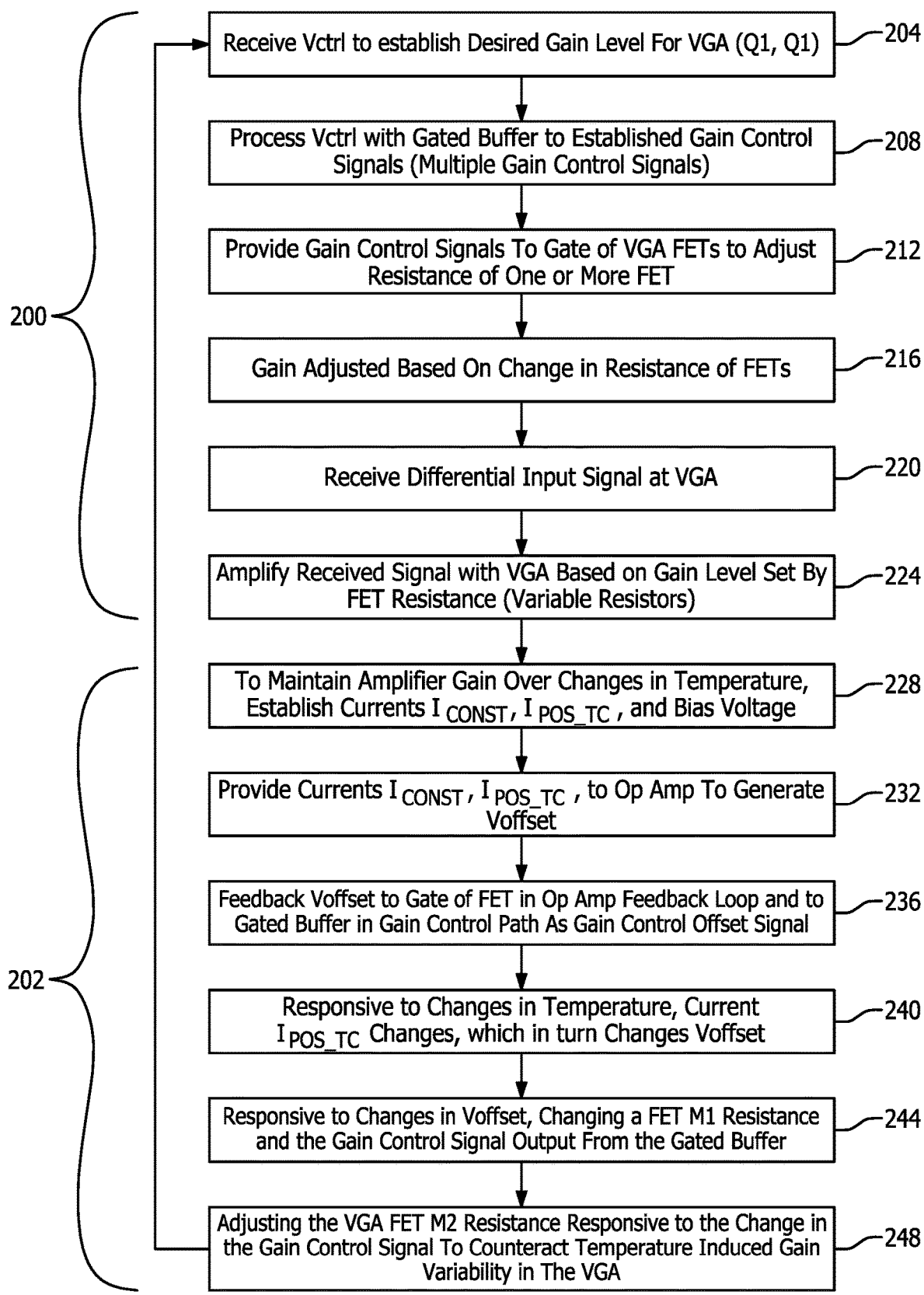
FIG. 2 illustrates an operational flow chart of an example method of operation.

FIG. 2 illustrates an operational flow chart of an example method of operation. This is but one possible method operation and as such other methods are possible which do not depart from the claims. As an overview, amplification steps 200 occur simultaneously with the temperature compensation steps 202, although the flowchart appears in a linear progression. Separation of the steps in this manner aids in understanding, but is should be understood that these steps may occur dynamically and, in some instances, simultaneously.

In operation, at a step 204, the system receives a gain control signal, referenced herein as Vcrtl to establish the desired gain level for the amplifier, such as a VGA amplifier defined primarily by transistors Q1 and Q2 in FIG. 1. At a step 208, the gated buffer 140 processes the gain control signal Vcrtl to establish a gain control signal. In one embodiment, a gain control signal may be zero or a high voltage, which establishes the FET as an open circuit or as having a resistance. FETs with zero gate voltage are effectively take out of the circuit, while FETS with a non-zero gate voltage establish a resistance across the FET such that the actual resistance varies with gate voltage.

At a step 212, the gain control signals are provided to the gate of the FETS in the VGA to selectively remove the FET from the circuit (open circuit across FET) or establish the FET in the circuit with a resistance controlled by its gate voltage. The variance of the FET and their respective resistance control the gain of the amplifier.

At a step 216 the gain is set based on the resistance of each FET and thereafter, at a step 220, a differential signal is provided to the inputs of the VGA for amplification. Although described herein as an amplifier, it is contemplated that linear signal attenuation could alternatively occur based on the innovation disclosed herein. At a step 224, the VGA amplifies the receive signal based on the gain level set by the FET resistance, which is in turn controlled by the gain control signals provided to the gate of each FET.

Turning now to the temperature compensation step 202, at a step 228, it is assumed that temperature has changed. Temperature variance affects the gain of the amplifier elements Q1, Q2 because these devices have a negative temperature coefficient. The negative temperature coefficient characteristic of these devices results in non-constant gain as temperature changes which undesirably affects system operation. To counter the effects of temperature change induced gain variability, a temperature compensation circuit is provided which creates a temperature compensating offset voltage Voffset. As part of the creation of this offset voltage, several currents are established for use by the temperature compensation circuit, namely, a temperature independent current Iconst, a temperature dependent current Ipos_tc, and a bias voltage defined as the common mode voltage (V1+V2)/2. These currents and voltage are discussed above.

At a step 232, the currents Iconst, current Ipos_tc, in connection with the resistor R1 and FET M1, generate voltages Vm+ and Vm− and these voltages are provided as input to the operational amplifier. The voltage Vm− is constant over temperature because this voltage is defined as R1 times Iconst where Iconst is constant over temperature. The value of Vm+ is controlled to be generally the same as Vm− based on a feedback signal Voffset, which controls the gate voltage of FET M1. Voffset adjusts the resistance of FET M1 to force VM+ to be generally the same as VM−. Of importance, the current Ipos_tc has a positive temperature coefficient such that as temperature increases, Ipos_tc increases and as temperature decreases, Ipos_tc decreases.

At a step 236, this method of operation feeds back the Voffset signal, which is the output of the op amp 156 to the gate terminal of the FET M1 in the op amp feedback loop, and also to the gated buffer 140 in the gain control path. The Voffset signal provided to the gated buffer modifies the gain control signal output from the gated buffer 140. In one embodiment, the gated buffer 140 is configured such that a zero value input to the gated buffer is output as a zero value output regardless of the Voffset value, but a non-zero or high level input to the gated buffer is modified by the Voffset. This occurs because a zero level output from the gated buffer 140 is intended to maintain a particular FET M2 as an open circuit, which should not be changed if the temperature changes, but a non-zero or high level output from gated buffer is intended to adjust the resistance of a particular FET M2 and as such should be compensated in response to a change in temperature, to compensate for temperature induced changes in amplification linearity in amplifier transistors Q1 120A and Q2 120B. In one embodiment the output of the gated buffer may be 0 or 1.7 volts, and the offset voltage (Voffset) may vary the high output, such as to 1.5, 1.6, 1.8, 1.9 volts or any voltage as adjusted by the offset voltage.

At a step 240, responsive to the change in temperature, the current Ipos_tc changes, which in turn changes the voltage across FET M1 due to adjustments in the resistance in FET M1 (step 244). Changing the voltage across FET M1 changes the voltage Vm+ provided to the op amp 156, thus causing the op amp output Voffset to change. The new Voffset is provided to the gated buffer 140 as an offset signal to the gain control signal (step 244). The new Voffset signal (op amp output) is also feedback to the gate of the FET M1, causing its resistance to change (step 244) in a way that forces voltage Vm+ and Vm− to be at or near the same value. Further changes to Ipos_tc due to changes in temperature result in similar processing.

Also at a step 244, responsive to the changes in Voffset, the gain control signal is modified by the gated buffer 140 if the gain control signal is non-zero (at a level that will force the FETs M2 into triode region operation). At a step 248, the system adjusts the resistance across the FETs M2 (which are controlled to be resistive elements by the gain control signal) responsive to the change in the gain control signal due to changes in Voffset. Changing the resistance of the FETs M2 in response to changes in temperature, counteracts the effects of temperature induced non-linearity in the amplifier devices Q1 and Q2.

Behavior Resulting from Temperature Change

Situations of increasing temperature and decreasing temperature are discussed below in relation to Ipos_tc and the cascading effect on the other aspects of the temperature compensation circuit and the amplifier. The amplifier elements Q1 Q2 have a negative temperature coefficient and as such, in response to increasing temperature, the amplifier gain will decrease. To counter the decrease in gain, and also in response to increasing temperature, Ipos_tc will increase because it has a positive temperature coefficient. An increase in Ipos_tc results in an increase in voltage Vm+. This causes an increase in Voffset from the op amp, which in turn is fed back to the FET M1 which causes the resistance of the FET M1 to decrease to counter the increasing Ipos_tc. The increased Voffset is also provided to the gated buffer 140 to increase the gain control signals provided to FETs M2 which are operating in triode region as resistive elements. The increase in the gain control signal decreases the resistance across the FETs M2, which in turn increases the gain of the amplifier elements Q1, Q2, which effectively counteracts the temperature induced gain reduction in the amplifier elements Q1, Q2. A similar, but opposite process occurs in response to decreasing temperature.

Figure 3:
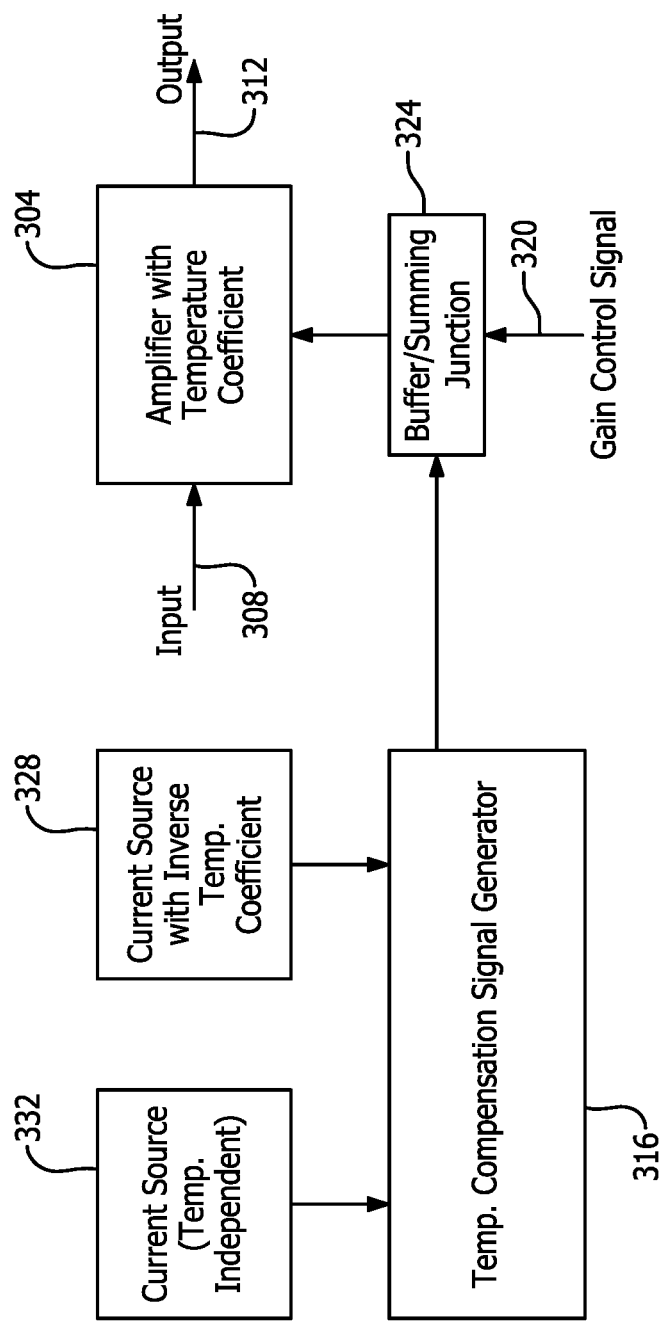
FIG. 3 illustrates a block diagram of an amplifier with a temperature compensation system.

FIG. 3 illustrates a block diagram of an exemplary temperature compensation circuit. This is one example embodiment and other embodiments are contemplated which do not depart from the scope of the claims. In this embodiment, an amplifier 304 is provided to receive an input signal on an input 308 and provide an amplified signal on an output 312. The amplifier 304 has an inherent temperature coefficient such that as temperature changes the gain of the amplifier also change, causing a nonlinear amplification over temperature. Gain of the amplifier is controlled by control signal provided on a gain control input 320. The control signal is provided to one or more buffers 324 or summing junction with control logic to process the control signal and provided it to the amplifier 304.

To compensate the amplifier's gain variability over temperature, a temperature compensation system is provided. In this configuration, the temperature compensation system is a temperature compensation signal generator 316 configured to generate a temperature compensation signal which is provided to the one or more buffers 324. The temperature compensation signal generator 316 receives a temperature independent current from a first current source 332. The current from the current source 332 does not vary with temperature changes. A second current source 328 is also present to provide a temperature dependent current to the temperature compensation signal generator 316. The current from the second current source 328 does vary with temperature changes.

In operation, the amplifier receives an input signal and performs amplification, based on the gain control signal, to generate an amplified signal. If temperature changes, the gain of the amplifier will change even if the gain control signal does not change. To counter the effects of changes in temperature on the gain of the amplifier, the temperature compensation signal generator 316 generates a temperature compensation signal that is provided to the buffer to selectively modify the gain control signal, such that when temperature decreases the gain of the amplifier the temperature compensation signal increases the gain of the amplifier. Similarly, when the temperature increases the gain of the amplifier the temperature compensation signal decreases the gain of the amplifier. The amount of gain compensation is proportional to the amount of change in gain resulting from the temperature change.

In summary, temperature compensation is achieved with a feedback circuit which defines the gate voltage for the NMOS transistor used for setting the VGA gain. Referring to FIG. 1 M2 represents several NMOS devices with individual controls to each gate. The gain of the VGA stage is varied by turning on one or more NMOS devices (M2). Assuming RE is sufficiently large, and RON of M2 (RON2, resistance across the FET M2) is sufficiently small, the gain of the stage is RC/(2re+RON2) where re (emitter resistance of devices Q1, Q2, also referred to as the small signal resistance of the NPN resistor) of each NPN device (Q1, Q2) has a positive temperature coefficient. For the NPN devices, re=$V_T$/Ic, where $V_T$ is the thermal voltage (kT/q) and Ic is collector current. As a result, re is directly proportional to T when Ic is constant with temperature. But for the gain stage, re is in the denominator of the expression for gain, so the gain has a negative temperature coefficient due to the positive temperature coefficient of re.

Temperature compensation is achieved by giving RON2 the appropriate negative temperature coefficient. A feedback circuit controls the gate of M1 so that RON1 equals R1 (where M1 is maintained in the triode region of operation.) R1 is biased with a current which is constant with temperature; and M1 is biased with a current which has a positive temperature coefficient; therefore, RON1 has a negative temperature coefficient by virtue of the feedback loop which forces both voltage drops across R1 and M1 to be equal. It follows that RON2 will have the same negative temperature coefficient as RON1 given that M2 matches M1 in a monolithic solution. The temperature coefficient of IPOS_TC can be defined differently for each VGA gain setting if required.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An amplifier with temperature compensation comprising:
    an amplifier having one or more transistors configured to amplify a received signal to create an amplified signal, the one or more transistor having gain that changes over temperature;
    a gain control circuit, connected to the amplifier, configured to adjust the gain of the amplifier responsive to a gain control signal;
    a temperature compensation circuit comprising:
    a constant current source configured to generate a constant current which is used to create a constant voltage;
    a temperature dependent current source configured to generate a temperature dependent current which is used to create a temperature dependent voltage, such that the temperature dependent current source has an inverse temperature dependance as compared to the amplifier;
    an operational amplifier configured to compare the constant voltage to the temperature dependent voltage and generate an offset signal which varies over temperature; and a gated buffer configures to receive the offset signal and responsive thereto, selectively modify the gain control signal.

2. The amplifier with temperature compensation of claim 1 wherein the temperature dependent current source varies over temperature inversely to the gain of the amplifier.

3. The amplifier with temperature compensation of claim 1 wherein the two or more transistors have a negative temperature coefficient that changes gain over changes in temperature.

4. The amplifier with temperature compensation of claim 1 wherein the gain control circuit includes one or more FETs and the gain control signal adjusts the resistance of the FETs in the gain control circuit.

5. The amplifier with temperature compensation of claim 1 wherein the offset signal is used to adjust a resistance that generates the temperature dependent voltage.

6. The amplifier with temperature compensation of claim 1 wherein the gated buffer receives a control signal to control gain and the control signal is modified by the offset signal.

7. An amplifier with a temperature compensated gain control comprising:
   an amplifier configured to amplify a received signal to create an amplified signal, the amplifier having a temperature coefficient that causes the gain to vary with changes in temperature such that the gain is determined based on a gain control signal;
   a gain control circuit configured to generate the gain control signal based on a control signal, wherein the gain control circuit comprises:
      two or more devices that function as variable resistors;
      a buffer which receives the control signal and a gain offset signal, and modifies the control signal based on the gain offset signal;
   a temperature compensation circuit configured to generate thea gain offset signal which selectively modifies the gain control signal such that the temperature compensation circuit has a temperature coefficient that is inverse to that of the amplifier; and
   a feedback loop, that is part of the temperature compensation circuit, the feedback loop configured with an operational amplifier which generates the gain offset signal such that the gain offset signal changes with changes in temperature.

8. The amplifier of claim 7 wherein the amplifier has a negative temperature coefficient and the temperature compensation circuit has a positive temperature coefficient.

9. The amplifier of claim 7 wherein the amplifier has a positive temperature coefficient and the temperature compensation circuit has a negative temperature coefficient.

10. The amplifier of claim 7 wherein the devices that function as variable resistors comprise transistors.

11. The amplifier of claim 7 wherein the temperature compensation circuit includes a current source which generates and output which is temperature dependent.

12. A method for temperature compensating amplifier gain comprising:
   providing an amplifier having a temperature coefficient that causes the gain of the amplifier to change with changes in temperature;
   providing a temperature compensation circuit that generates a gain offset signal such that the temperature compensation circuit has a temperature coefficient which is the inverse of the amplifier's temperature compensation circuit;
   receiving an input signal for amplification;
   amplifying the signal with an amplifier to create an amplified signal, the level of amplification determined by a gain control signal;
   generating a gain offset signal with the temperature compensation circuit such that the gain offset signal counteracts the effects of temperate change induced gain variation in the amplifier to thereby maintain linearity in the amplified signal over temperature; and
   receiving a control signal and the gain offset signal at a buffer and modifying the control signal with the gain offset signal to generate the gain control signal.

13. The method of claim 12 wherein the amplifier includes one or more transistors which have a negative temperature coefficient and the temperature compensation circuit includes one or more current sources which have a positive temperature coefficient.

14. The method of claim 12 wherein the gain control signal comprises two or more signals which are provided to two or more FETs to selectively adjust the resistance across the two or more FETS, which in turn controls the gain of the amplifier.

15. The method of claim 12 further comprising generating the gain offset signal with a feedback loop within the temperature compensation circuit such that the feedback loop includes a feedback signal that changed with changes in temperature.

* * * * *